United States Patent [19]

Sasai et al.

[11] Patent Number: 4,702,781
[45] Date of Patent: Oct. 27, 1987

[54] LIQUID PHASE EPITAXIAL GROWTH METHOD

[75] Inventors: Yoichi Sasai, Hirakata; Minoru Kubo, Katano, both of Japan

[73] Assignee: Matsushita Electric Industrial Co., Ltd., Osaka, Japan

[21] Appl. No.: 787,369

[22] Filed: Oct. 15, 1985

[30] Foreign Application Priority Data

Oct. 16, 1984 [JP] Japan ................................ 59-216654

[51] Int. Cl.⁴ ........................................... H01L 21/208
[52] U.S. Cl. ..................................... 437/129; 437/121
[58] Field of Search .............. 148/171, 172; 29/569 L, 29/576 E

[56] References Cited

U.S. PATENT DOCUMENTS

| 3,664,294 | 5/1972 | Solomon | 148/171 X |
| 4,052,252 | 10/1977 | Lockwood et al. | 148/171 X |
| 4,063,972 | 12/1977 | Akai et al. | 148/171 |
| 4,426,702 | 1/1984 | Yamashita et al. | 148/171 X |
| 4,566,171 | 1/1986 | Nelson et al. | 29/569 L |
| 4,578,127 | 3/1986 | Gossard et al. | 29/576 E |

OTHER PUBLICATIONS

E. A. Rezek et al., "Quantum- Well InP-In$_{1-x}$Ga$_x$P$_{1-z}$As$_z$ heterostructure Lasers Grown by Liquid Phase Epitacy (LPE)", Journal of Electronic Materials, vol. 9, No. 1, 1980, pp. 1-24.

Primary Examiner—George T. Ozaki
Attorney, Agent, or Firm—Wenderoth, Lind & Ponack

[57] ABSTRACT

Disclosed is a liquid phase epitaxial growth method using a slider having a recess which receives a semiconductor substrate, and a growth boat having a solution holder which holds plural kinds of solutions for use in epitaxial growth, in which method, epitaxial growth of a layer having thickness of less than 500 Å is carried out under the condition that the slider is sliding in one direction, i.e., without stopping the sliding movement of the slider. Thereby, the thickness of the growth layer is controlled by controlling the time when the substrate contacts the solution, or by the sliding speed of the slider.

13 Claims, 17 Drawing Figures

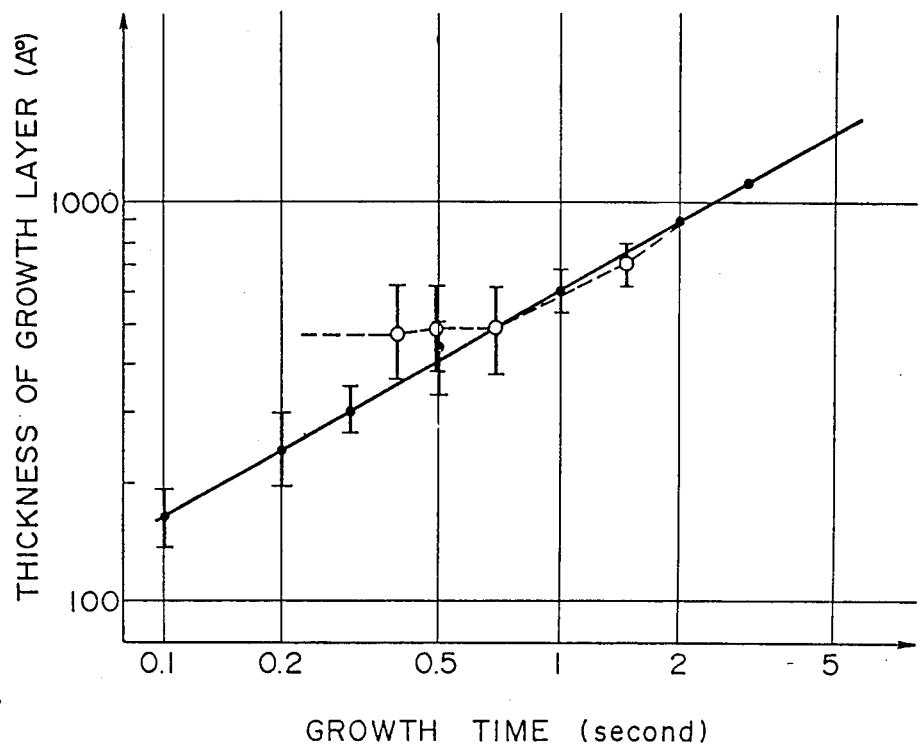

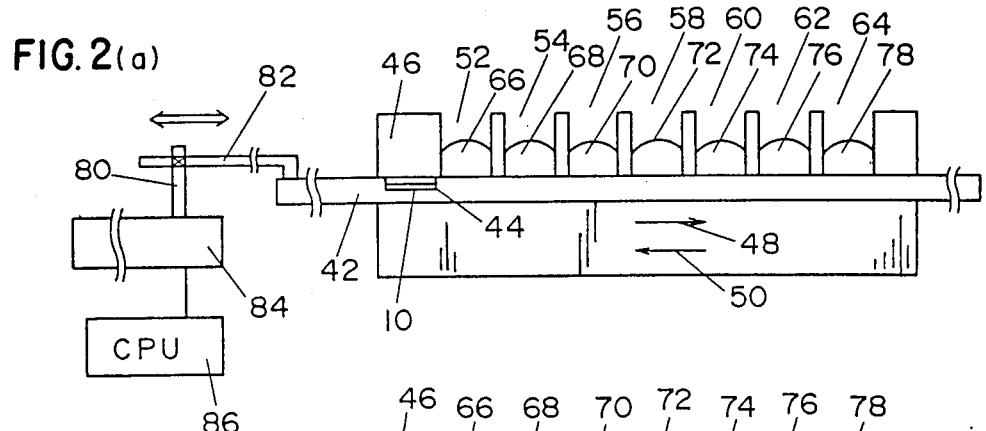
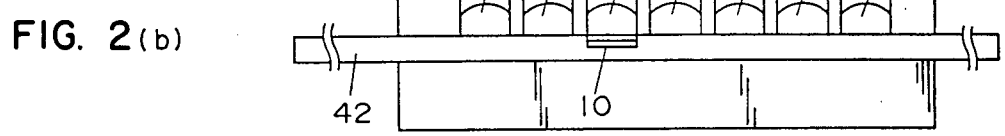
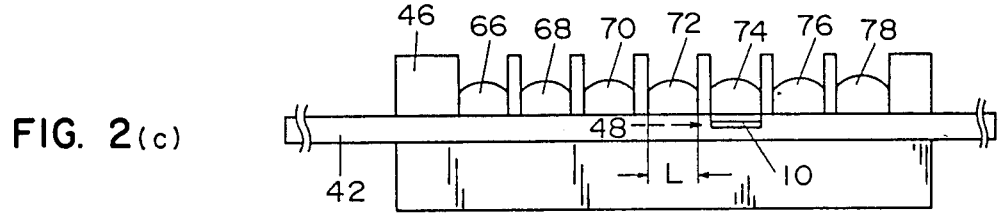
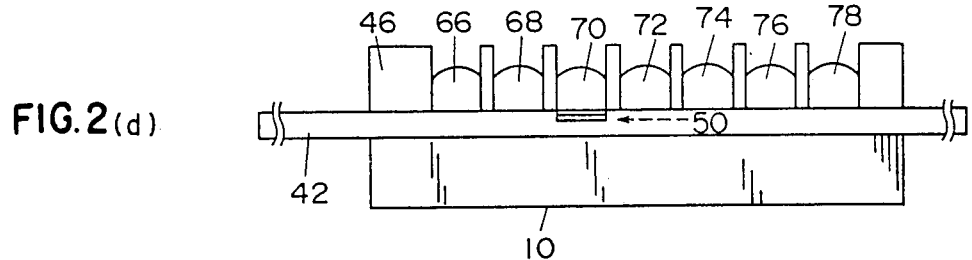

LIQUID PHASE EPITAXIAL GROWTH METHOD

BACKGROUND OF THE INVENTION

This invention relates to a liquid phase epitaxial growth method, and more particularly, to an epitaxial growth method which may be used in the production of an extremely thin epitaxial growth layer.

A liquid phase epitaxial (LPE) growth method, in which a III-V group compound semiconductor such as GaAs, InP, etc., has been used as the principal method of growing epitaxial layers. The advantages of such LPE method is that crystals of high quality may be readily obtained, but the method has a drawback in that it is difficult to form extremely thin films of less than approximately 500 Å. The reason is that it is so difficult to control the thickness of the epitaxial growth layers in such method is that the growth speed is inherently fast and the growth time is short. Therefore, in the growth of extremely thin epitaxial films or in the growth of multi-quantum well epitaxial layers, formed by accumulating a plurality of extremely thin epitaxial layers, a molecular beam epitaxy (MBE) method, a vapor phase epitaxy (VPE), and a metal organic chemical vapor deposition method (MOCVD) are used. However, these methods are generally inferior to a liquid phase epitaxial method in that the apparatuses used for such methods are expensive and it is difficult to obtain good crystal characteristics from such methods.

In a conventional LPE growth method for producing crystals, a growth boat is used which has a growth solution holder and a substrate holder. The growth solution holder and substrate holder are designed such that one is slidable in respect to the other. The growth of crystals is carried out by stopping the movement of the solution on the substrate and by contacting the solution and the substrate for a predetermined time. Suppose that, in this conventional method $t_1$ represents the time for completely contacting the solution with the substrate, $t_2$ is time for maintaining contact between the solution and the substrate and $t_3$ is the time for completely wiping-off the substrate from the solution by re-starting the sliding operation of the substrate. The crystal is grown on the substrate in transition time $(t_1 + t_3)$ when the substrate is slid in respect to the substrate, as well as in time $t_2$; therefore, it is impossible to precisely define the effective growth time. In case of a long time growth, the time $(t_1 + t_3)$ is negligible. However, in case of a short time growth, it is extremely difficult to control the thickness of an extremely thin growth layer with high reproducibility, since it is impossible to control the growth time.

To suppress the transition time to the extent possible, a growth method has been employed which uses a vertical-type rotary growth boat (see the Journal of Electronic Materials, Vol. 9, 1980, pp 1-27, by E. A. Rezek et al.). In this method, a member for sliding the boat is directly connected to a drive motor and, therefore, the transition time is reduced. However, there is a limit in respect to reducing the transition time by use of this method, and therefore the method cannot become the best improvement method. Further, the method uses a vertical boat, and it is complicated to insert a boat into the reactor and remove the boat therefrom as compared with methods employing a horizontal boat. Since the size of the substrate is determined by the diameter of the reactor tube, it is difficult to obtain a wide effective space and the method is therefore not suitable for mass production. Still further, in cases where such method is used for applying buried epitaxial growth layers on a substrate in which mesas or grooves are formed in a stripe-shaped manner, there occurs deviations in the thickness of extremely thin epitaxial growth layers on a substrate since sliding speed differs between the rotary center portion of the substrate and the outer edge portion thereof.

SUMMARY OF THE INVENTION

It is a principal object of the invention to provide a liquid phase epitaxial (LPE) growth method which is capable of producing an extreme thin film with high reproducibility and of producing multi-quantum well epitaxial layers.

Another object of the invention is to provide a method which is capable of mass-producing a multi-quantum well semiconductor laser.

These and other objects will be accomplished by means of a LPE growth method using a substrate holder for holding a substrate on which in epitaxial growth layer is formed, and a solution holder which holds a solution for use in epitaxial growth, wherein the improvement comprises sliding one of the substrate holder and solution holder against the other thereof at a predetermined constant speed, and forming an epitaxial growth layer having a thickness of less that 500 Å on a substrate by contacting the surface of the substrate to the solution under such condition that one of the holders is slid against the other without stopping the sliding movement of one of the members. By this method, the thickness of the epitaxial growth layer can be controlled by controlling the time when the substrate contacts said solution.

In a specific embodiment, the substrate is a compound semiconductor substrate and the epitaxial growth layer is a compound semiconductor crystal. The substrate may be an InP substrate and the epitaxial growth layer may be an InGaAsP layer.

This invention also relates to a LPE growth method using a substrate holder having a recess for receiving a semiconductor substrate on which epitaxial growth layers are formed, and a growth boat having a solution holder for holding plural kinds of solutions for use in epitaxial growth. The improvement comprises sliding the substrate holder against the solution holder at a predetermined constant speed in a first direction, forming a first epitaxial growth layer having a thickness of less than 500 Å on the substrate under such conditions that the substrate holder slides against the solution holder without stopping the sliding movement of the substrate holder, whereby the thickness of the first epitaxial growth layer can be controlled by controlling the time when the substrate contacts a first solution of the solutions. A second epitaxial growth layer is then formed having a thickness of more than 500 Å on the first epitaxial growth layer under such conditions that the sliding movement of the substrate holder is stopped whereby the thickness of the second epitaxial growth layer is controlled by controlling the time when the substrate holder is maintained in a stopped position under such condition that the substrate contacts a second solution of the solutions, and the steps of forming the first and second epitaxial growth layers are repeated by moving the slider in a second direction opposite to the first direction so that a third epitaxial growth layer of less than 500 Å thickness is formed on the second epitaxial growth layer and a fourth epitaxial growth layer of more than 500 Å thickness is formed on the third epitaxial growth layer.

In a specific embodiment, the plural epitaxial growth layers are of a multi-quantum well epitaxial layers. The plural epitaxial growth layers may be used for producing a semiconductor laser.

This invention further relates to an LPE growth method using a substrate holder having a recess for receiving a semiconductor substrate on which epitaxial growth layers are formed, and a growth boat having a solution holder for holding plural kinds of solutions for use in epitaxial growth in which the improvement comprises sliding the substrate holder against the solution holder at a predetermined constant speed in a first direction, forming a first epitaxial growth layer having thickness of less than 500 Å on the substrate under such conditions that the substrate holder is slid against the solution holder without stopping the sliding movement of the substrate holder, whereby the thickness of the first epitaxial growth layer is controlled by controlling the time when the substrate contacts a first solution of said solutions. A second epitaxial growth layer having thickness of less than 500 Å is then formed on the first epitaxial growth layer under such conditions that the slider is slid against the solution holder, without stopping the sliding movement of the slider, whereby the thickness of the second epitaxial growth layer is controlled by controlling the time when the substrate contacts a second solution of the solutions. The slider is then slid against the solution holder at the predetermined constant speed in a second direction opposite to the first direction, and the steps of forming said second and first epitaxial growth layers is repeated by the sliding movement of the substrate holder in a second direction.

The invention has various advantages among which are as follows:

In the invention method, a LPE growth is carried out without stopping the sliding movement of a substrate holder, i.e., under such conditions that the holder is moving, whereby the thickness of the growth layer is controlled by controlling the speed of the holder movement so that an extremely thin epitaxial growth layer can be obtained. By use of this method, a good multi-quantum well epitaxial growth layer made of plural extremely thin layers can be readily obtained.

While the novel features of the invention are set forth particularly in the appended claims, the invention, both as to its organization and content, will be better understood and appreciated, along with other objects and features thereof from the following detailed description taken in conjunction with the drawings.

BRIEF DESCRIPTION OF THE DRAWINGS

FIG. 1 is a graph showing the thickness of growth layer vs. the growth time according to the invention;

FIGS. 2(a)-2(d) are representations explaining an embodiment of the invention;

DETAILED DESCRIPTION OF THE INVENTION

One of the principal features of the invention is to carry out the growth under such conditions that the substrate is kept sliding without stopping during the period when the solution contacts the substrate. This sliding movement of the substrate is a linear movement and not a rotational movement. That is, the substrate moves in one direction or back and forth linearly. The growth time can be precisely controlled by calculating the time in which the solution contacts the substrate, under such conditions that the sliding speed of the substrate is kept constant. That is, growth time tg is calculated by the ratio l/V wherein l is the length of solution area in the direction of sliding of the substrate and V is the sliding speed of the substrate.

As a first example of the invention, an experiment was carried out in which InP was grown by a LPE growth procedure under such conditions that growth temperature is 600° C., the super saturation is −5° C. and the cooling rate is 0.7° C./min. by using the inventive method. The result of the experiment is shown in FIG. 1 by a thick line, whereas the dotted line in FIG. 1 shows the result of an experiment by use of a conventional method under the above-stated same conditions. As apparent from FIG. 1, by use of the invention, the thickness of the growth layer changes linearly according to the growth time, and saturation of the growth layer thickness does not occur so that it is possible to control the thickness of the film.

As stated above, in the invention, the substrate moves to produce a growth layer; i.e., it does not stop during the period for producing the growth layer, unlike conventional methods. It is also possible to move the solution against the substrate by changing the structure of the growth boat to obtain the same advantages shown in FIG. 1. As stated above, the present invention enables one to produce a growth layer of an extremely thin film.

Figure 4:
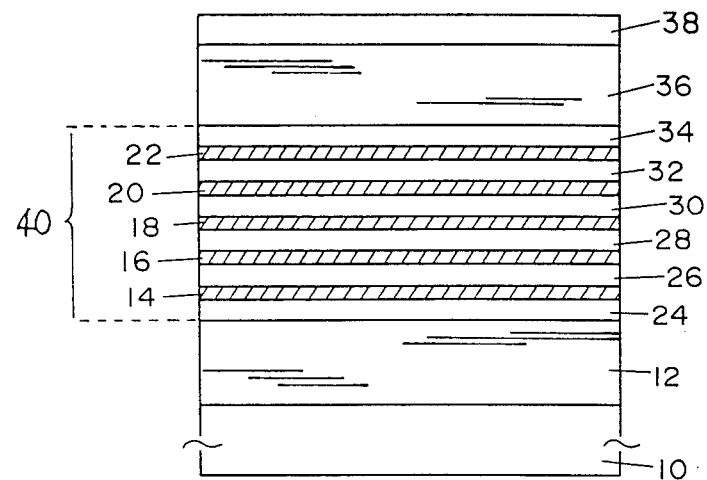
FIG. 4 is a sectional view of a wafer including multiquantum well layers which is produced by the method shown in FIGS. 2(a)-2(d)

As a second example of the invention, there will now be explained a method for producing an InGaAsP/InP series multi-quantum well epitaxial growth wafer as shown in FIG. 4, which is used for a multi-quantum well semiconductor laser shown in FIG. 6. The wafer comprises, as shown in FIG. 4, a (100)S-doped InP substrate 10, a Te-doped n-type InP buffer layer ($n=1\times10^{18}cm^{-3}$) 12, undoped 1.3 μm InGaAsP well layers 14, 16, 18, 20, and 22, undoped 1.1 μm InGaAsP barrier layers 24, 26, 28, 30, 32, and 34, a Zn-doped p-type InP cladding layer 36 and a Zn-doped p-type InGaAsP contact layer 38. 40 shows a multi-quantum well region.

The wafer is produced according to the invention method by use of a horizontal slide-type growth boat shown in FIG. 2. In FIG. 2(a), a substrate holder 42 has a recess 44 which holds the InP substrate 10 therein.

The substrate holder 42 is mounted in a solution holder 46 which is slidable in the directions of the arrows 48 and 50. The solution holder 46 has seven (7) portions or holes 52, 54, 56, 58, 60, 62, and 64 which receive melt-back solution 66, a solution 68 for InP buffer layer, a solution 70 for a 1.1 μm InGaAsP barrier layer, a solution 72 for a 1.3 μm InGaAsP well layer, a solution 74 for a 1.1 μm barrier layer, a solution 76 for a p-type InP cladding layer, and a solution 78 for a p-type InGaAsP contact layer. One end of the substrate holder 42 is connected to a drive member 80 through connection rod 82 which is driven by port loader 84 including a stepping motor (not shown) in the directions of arrows 48 and 50. The port loader 84 is controlled by a microprocessor, i.e., CPU 86 in controlling the sliding speed of the substrate holder 42 and the growth time.

The process of epitaxially growing a multi-quantum well structure will now be explained.

According to the situation in FIG. 2(a), the substrate holder 42 slides in the direction of arrow 48. When the entire surface of the substrate 10 contacts the melt-back solution 66, the substrate holder 42 stops its sliding movement so that the surface of the substrate is melted back. Thereafter, the substrate holder 42 again slides in the direction of arrow 48 and stops its sliding movement when the entire surface of the substrate 10 contacts the solution 68 for production of a buffer layer such that an n-type buffer layer 12 is grown on a substrate 10.

After the growth of the n-type buffer layer 12, the substrate holder 42 again slides in the direction of arrow 48 and stops its sliding movement when the entire surface of the substrate 10 contacts solution 70 for producing the 1.1 μm InGaAsP barrier layer 24 so that a barrier layer 24 is grown on the buffer layer 12 on substrate 10.

Right after the growth of barrier layer 24, the substrate holder 42 again slides in the direction of arrow 48 and stops its sliding movement when the entire surface of substrate 10 contacts the solution 74 for producing a 1.1 μm barrier layer. That is, in this step, the substrate holder 42 moves from the FIG. 2(b) situation to the FIG. 2(c) situation without stopping on its way. In other words, the substrate holder 42 does not stop when the substrate 10 contacts the solution 72 for the production of the 1.3 μm InGaAsP well layer. The sliding speed of the substrate holder 42 in this step is a constant 50 mm/sec. and the substrate 10 contacts the solution 72 as a result of the constant speed-sliding movement of the substrate 10 so that a InGaAsP well layer 14 is grown on the InGaAsP barrier layer 24 on substrate 10. In this step, since the length l of the solution portion 72 is 10 mm and the sliding speed is 50 mm/sec. as stated above, the growth time of the well layer is 0.2 second. Further, under the situation that the entire surface of substrate 10 contacts solution 74 for the formation of a 1.1 μm barrier layer as shown in FIG. 3 (c), a 1.1 μm barrier layer 24 is grown on the InGaAsP well layer 14.

Right after the growth of the barrier layer 26, the substrate holder 42 slides in the direction of the arrow 50, i.e., in the opposite direction of the arrow 48 and stops its sliding movement when the entire surface of the substrate 10 contacts the solution 70 for production of a 1.1 μm barrier layer 26 grown in the InGaAsP well layer 14.

Right after the growth of the barrier layer 26, the substrate holder 42 slides in the direction of the arrow 50, i.e., in the opposite direction of the arrow 48 and stops its sliding movement when the entire surface of the substrate 10 contacts the solution 70 for production of a 1.1 μm InGaAsP barrier layer. That is, in this step, the substrate holder 42 moves from the FIG. 2(c) situation to the FIG. 2(d) situation without stopping on its way, like the above-stated step. The substrate holder 42 does not stop when the substrate contacts the solution 72 for producing the 1.3 μm InGaAsP well layer. The sliding speed of the substrate 42 in this step is 50 mm/sec. as stated above so that substrate 10 contacts the solution 72 at a constant speed-sliding movement for a period of 0.2 second so that the InGaAsP well layer 16 is grown on an InGaAsP barrier layer 26. Under a FIG. 2(d) situation, like the FIG. 2(c) situation, an InGaAsP barrier layer 28 is grown on a InGaAsP well layer 16.

Figure 3:
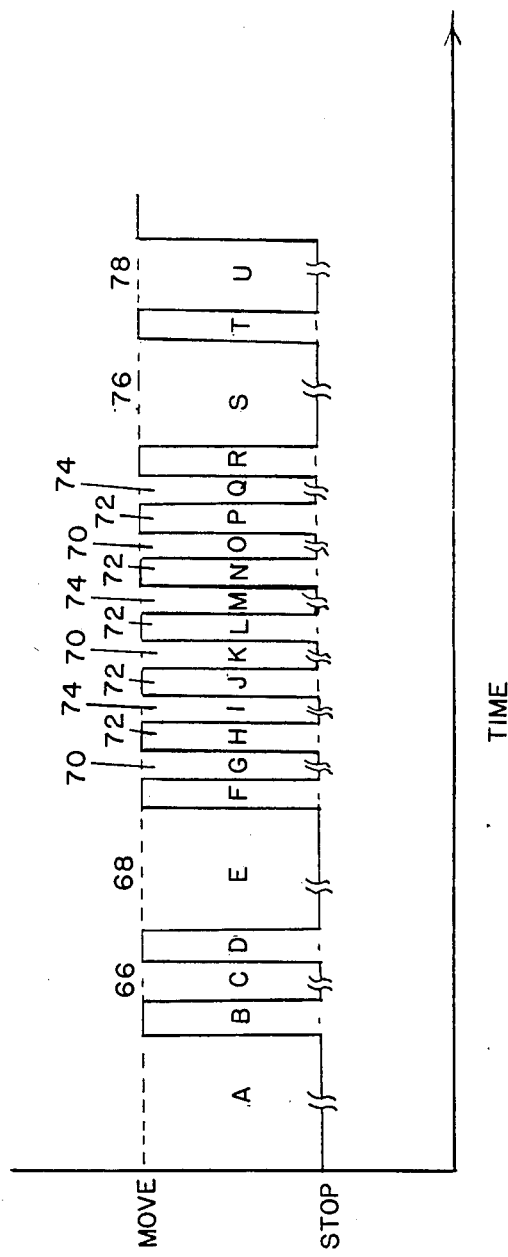
FIG. 3 is a time chart for explaining the movement of the substrate holder of FIG. 2.

By repeating the above-stated processes, i.e., FIG. 2(b), FIG. 2(c), FIG. 2(d), FIG. 2(b), InGaAsP well layers 18, 20, and 22, and InGaAsP barrier layers 30, 32 and 34 are grown on substrate 10 as shown in FIG. 3. By this procedure a multi-quantum well (MQW) region 40 is formed.

After the growth of the MQW region 40, the substrate holder 42 slides in the direction of the arrow 48 and stops its sliding movement when the entire surface of the substrate 10 contacts the solution 76 for producing a p-type InP cladding layer so that a cladding layer 36 is grown on a barrier layer 34. Then the substrate holder 42 slides in the direction of arrow 48 and stops its sliding movement when the entire surface of the substrate 10 contacts the solution 78, producing the p-type InGaAsP contact layer so that a contact layer 38 is grown on a cladding layer 36. Thereafter, the substrate holder 42 slides in the direction of arrow 48 and the substrate 10 is removed from recess 44, and then the slider 42 returns to its original position to receive a new substrate in recess 44.

In the above-stated processes, the growth conditions are set in such manner that the cooling rate is 0.7° C./min. and the growth temperature of the MQW layer is 589° C. In conventional methods, the growth temperature is set to be around 640° C. The reason why the growth temperature is set at 589° C., i.e., lower than conventional temperatures, is that the growth speed decreases by less than half of the normal growth speed and the steep characteristics of the hetero-interface is improved.

The thickness of each well layer 14, 16, 18, 20, and 22 is approximately 200 Å, i.e., extremely thin. In contrast, the thickness of each barrier layer 24, 26, 28, 30, and 34 is 400 Å–600 Å, which layers are formed under conditions such that the slider 42 stops its sliding movement.

FIG. 3 shows the timing of a move-stop movement of the substrate holder 42. A–U defines the time period as follows.

| | | | |
|---|---|---|---|
| A: | 120 min. | L: | 0.2 sec. |
| B: | 0.2 sec. | M: | 1 sec. |
| C: | 3–5 sec. | N: | 0.2 sec. |
| D: | 0.2 sec. | O: | 1 sec. |
| E: | 600 sec. | P: | 0.2 sec. |
| F: | 0.2 sec. | Q: | 1 sec. |
| G: | 1 sec. | R: | 0.2 sec. |
| H: | 0.2 sec. | S: | 600 sec. |
| I: | 1 sec. | T: | 0.2 sec. |
| J: | 0.2 sec. | U: | 20 sec. |
| K: | 1 sec. | | |

At time period A, the substrate 10 is kept in a stop position in which the substrate 10 is heated up to the melt-back temperature.

Thereafter, the substrate 10 slides for period B and stops to contact the solution 66 for a period C. After the completion of the melt-back, the substrate 10 slides for period D and stops to contact the solution 68 for period E. After the completion of the n-InP buffer layer, the substrate 10 slides for a period F and stops to contact the solution 70 for a period G. After the completion of a 1.1 μm barrier layer, the substrate 10 slides for a period H. At this step, the substrate 10 contacts the solution 72 and 1.3 μm well layer is formed. Then the substrate 10 stops to contact the solution 74 for a period I.

Thereafter, the substrate 10 slides in the opposite direction for a period J to thereby form a well layer and stops to contact the solution 70 for a period K. This back and forth movement is repeated for periods L–Q to form the MQW layers.

Thereafter, the substrate 10 slides for a period R and stops to contact the solution 76 for a period S. After the p-InP cladding layer is formed, the substrate slides for a period T and stops to contact the solution 78 for a period U. Finally, the substrate 10 slides to a position to be removed.

The wafer of the structure shown in FIG. 4 is used for producing a BH. MQW-type semiconductor laser as shown in FIG. 6. In FIG. 6, 88 and 90 are a p-type InP layer and a p-type InP layer, respectively, and 92 and 94 are a p-type electrode and an n-type electrode, respectively.

Figure 5A:
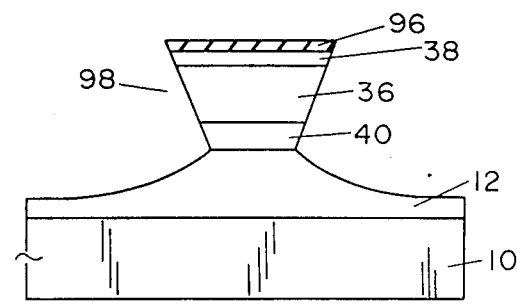
FIGS. 5(a) and 5(b) are representations explaining a method for producing a semiconductor laser by use of the wafer of FIG. 4.
Figure 5B:
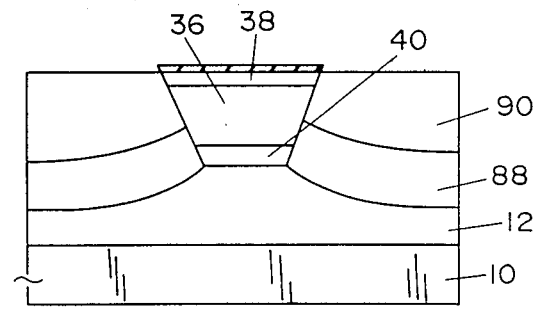
Figure 6:
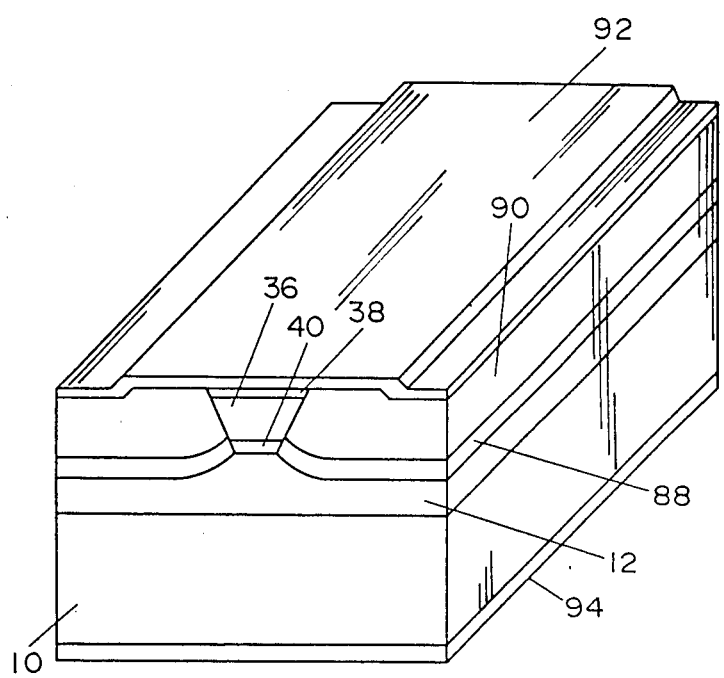
FIG. 6 is a perspective view of the semiconductor laser which is produced by the method shown in FIGS. 5(a) and 5(b)
Figure 8:
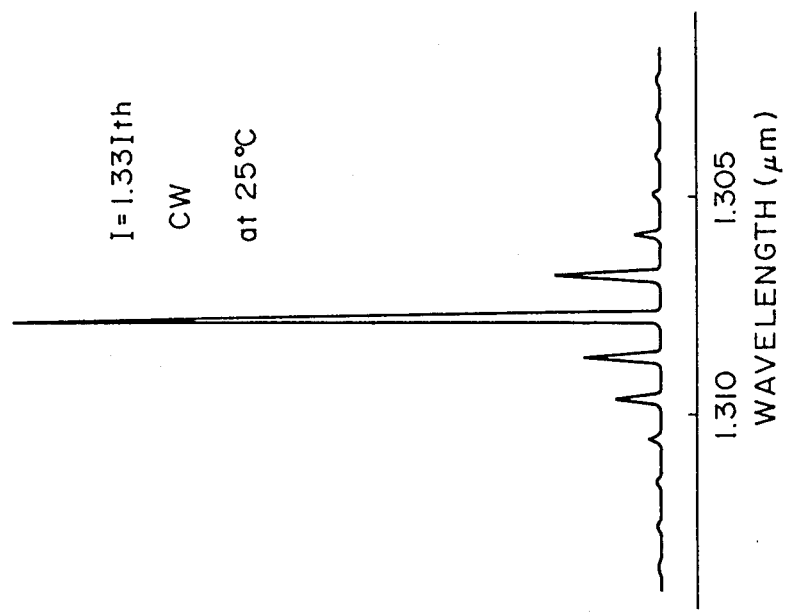
FIGS. 7 through 11 show the characteristics of the semiconductor laser of FIG. 6.

The semiconductor laser of FIG. 6 is produced by the processes shown in FIG. 5.

First, the wafer of FIG. 4 is mesa-etched using the insulating film 96 as a mask which is applied to a contact layer 38 so that the mesa configuration 98 shown in FIG. 2(a) is obtained.

Then both sides of the mesa 98 are buried by a p-type InP layer 88 and an n-type InP layer 90 so that a BH structure of a semiconductor laser is produced. Thereafter, electrodes 92 and 94 are formed on the top and bottom surfaces of the BH structure so that a BH-InGaAsP-MQW-type semiconductor laser with a stripe width of approximately 2 μm as shown in FIG. 6 is obtained.

Figure 7:
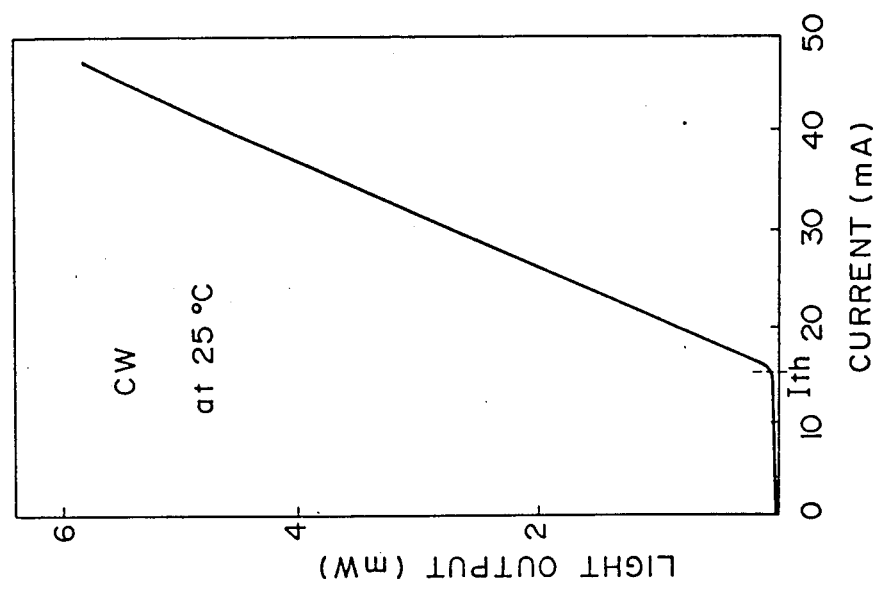

FIGS. 7–11 show the characteristics of the FIG. 7 semiconductor laser. FIG. 7 shows the light current characteristic in a typical CW operation at room temperature, 25° C. The threshold current value, Ith, is 15 mA, and characteristically good linearity is obtained. The threshold value of 15 mÅ is the same as or better than that of a conventional bulk laser, and lower than the threshold value, 40–60 mÅ of an InGaAsP-MQW-type laser produced by a conventional LPE growth method [see, Electron Letter 20, 727 (1984)]. Therefore, it is apparent that a crystal of good quality is obtained.

FIG. 7 shows a longitudinal mode oscillation spectrum of the laser under such conditions that the current is a 1.33 multiple of Ith (threshold current). As apparent from FIG. 8, the laser oscillates in an almost single-mode.

Figure 9:
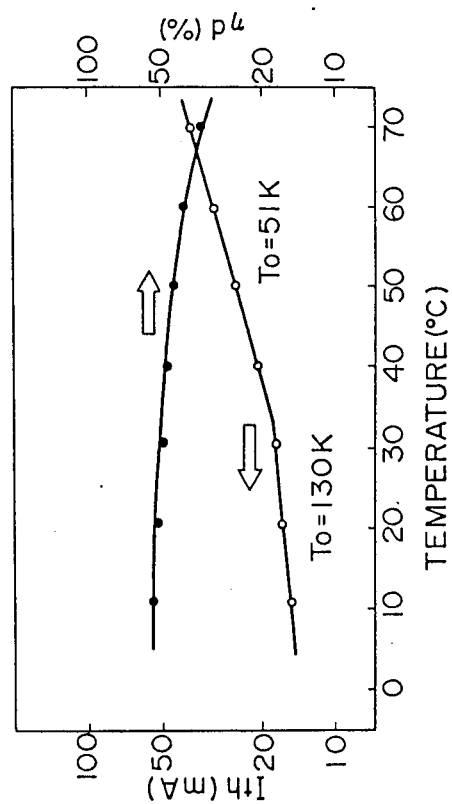

FIG. 9 shows the characteristics of the threshold current Ith and the temperature of the external differential quantum efficiency. The characteristic temperature $T_0$, [Ith $\propto I_0$ exp $(T/T_0)$], which is the index of the temperature characteristics of a semiconductor laser, is 130K at around 30° C., which is considerably larger than the $T_0$, 50–70K, of a conventional bulk laser. This represents the quantum size effect. In FIG. 9, ηd shows the external differential quantum efficiency.

Figure 10:
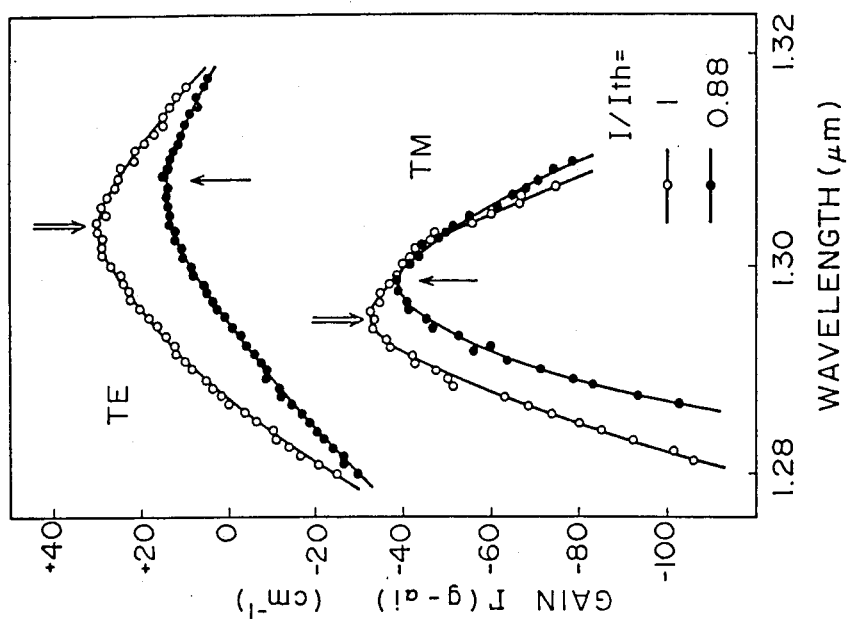

Further, the gain characteristics of a MQW-type semiconductor laser is checked to confirm the quality of the MQW layer produced by the invention method. FIG. 10 shows the gain spectrum of the TE, TM mode. As apparent from FIG. 10, the gain for the TE mode is considerably larger than that for the TM mode, and the peak of the TE mode spectrum is located as a longer wavelength side as compared to the peak of a TM mode spectrum. Further, when the injection current increases, the peaks are shifted to the short wavelength side.

Figure 11:
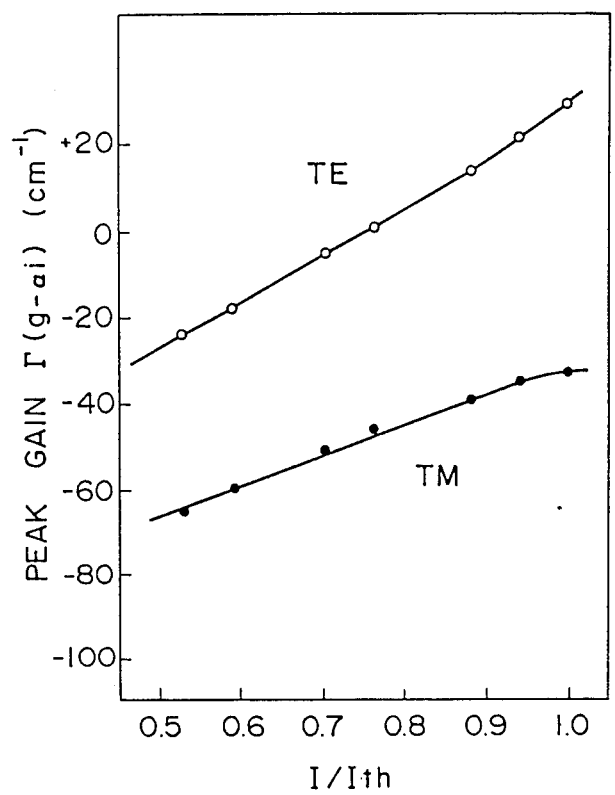

FIG. 11 shows the characteristics of the peak gain vs. the I/Ith (I: injection current, Ith: threshold current). As shown in FIG. 10, the difference of gain at the threshold value (I/Ith=1.0) is approximately 65 cm$^{-1}$, which is considerably larger than that ( 10 cm$^{-1}$) of the conventional bulk laser. The gain characteristics of the TE, TM mode shown in FIG. 10 represents the apparent quantum size effect, i.e., the fact that good extremely thin films are formed, unlike conventional methods.

In the above embodiment, an InGaAsP-MQW-type semiconductor laser of FIG. 6 is produced by use of a LPE growth apparatus as shown in FIG. 2. In the FIG. 2 structure, the substrate 10 temporarily stops when the substrate 10 contacts the solutions 15, 17 as shown in FIGS. 2(b)-2(d), so that the barrier layers are necessarily formed thick.

Figure 12:
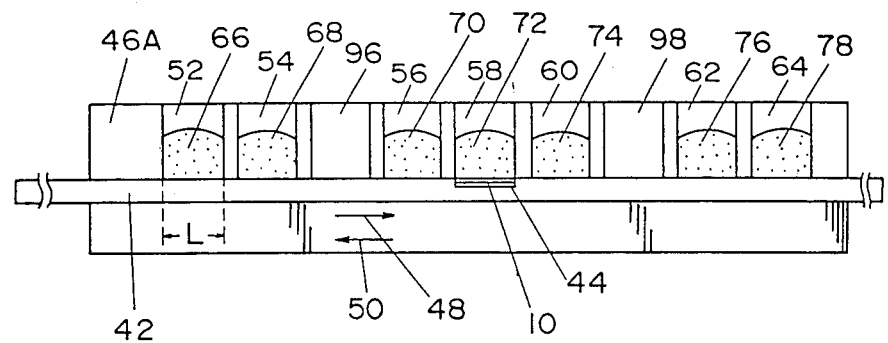
FIGS. 12 and 13 are representations explaining other embodiments of the invention.

To make the barrier layers thinner, a structure as in FIG. 23 is used. In FIG. 22, like components of FIG. 2 are designated by like numbers. That is, solution holder 45A has two dummy portions which do not receive any solutions. In FIG. 12, an InP substrate 10 which is received in recess 44 of a substrate holder 42 slides in the direction of arrow 48. The substrate 10 stops its sliding movement at a position below the melt-back solution 66 for a predetermined time (normally a few seconds) and then slides in the same direction to contact the solution 68 for producing a barrier layer.

Thereafter, a substrate 10 slides in the same direction at a predetermined constant speed V. In this case, it takes time t(=L/V, wherein L:s length of portions 52–64 and 96, 98) for the substrate 10 to pass through the solution portion 56, during which time an InGaAsP barrier layer is formed. In the same manner, an InGaAsP well layer is formed when a substrate 10 passes through a solution portion 58, and an InGaAsP barrier layer is formed when a substrate 10 passes through a solution portion 60. Like the previous embodiment, the substrate 10 does not stop its sliding motion when it passes through the solution portions 56, 58 and 60.

Thereafter, the substrate 10 stops its sliding movement when it comes under the dummy portion or the hole 98. Then the substrate 10 slides in the opposite direction, i.e., in the arrow 50 direction, and passes through solution portions 60, 58 and 56, and then stops its movement when it comes under dummy portion 96. By repeating the above-stated processes, an MQW layer 40 is obtained. In this embodiment, the substrate 10 passes twice through portion 56 for producing a barrier layer, and twice through portion 60. Therefore, if the passing time of the solution portion 58 must be the same as that of portion 56, 60, the length L of portion 56, 60 must be half of that of portion 58. In the above embodiments, portion 60 which receives solution 74 for producing an InGaAsP barrier layer may be omitted.

In the above embodiments, the formation of an InP-/InGaAsP-MQW epitaxial layer on an InP substrate is explained, but other materials, which may be used for LPE growth can be used instead of the above-stated InP/InGaAsP materials.

Figure 13:
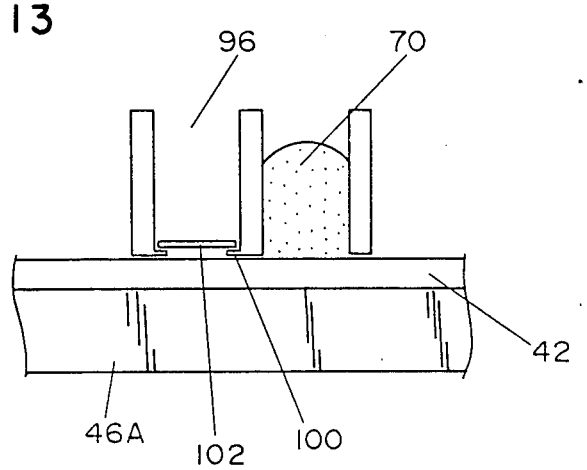

In case a material is used which may be subject to heat damage on the surface of the substrate when exposed to high temperature, such as an InP substrate, it may be necessary to provide a projection 100 (see FIG. 13), on which a substrate protection cover 102 is mounted with a dummy portion 96. Alternatively, it may be good for form a p-gas atmosphere sufficient to cause heat damage by supplying a Ph3 gas into a reactor tube. Further, it may be good to make the thickness of the side wall of the dummy portion thick so that substrate 10 does not contact the solution.

While the specific embodiments of the invention have been illustrated and described herein, it must be realized by those skilled in the art that many modifications and changes can occur. It is, therefore, to be understood that the appended claims are intended to cover all modifications and changes which fall within the true spirit and scope of the invention.

What we claim is:

1. In a liquid phase epitaxial growth method using a substrate holding member for holding a substrate on which an epitaxial growth layer is formed, and a solution holding member which holds solution for use in epitaxial growth, the improvement comprising:

sliding one of a substrate holding member and a solution holding member against the other thereof at a predetermined constant speed; and forming an epitaxial growth layer having a thickness of less than 500 Å on a substrate by contacting the surface of said substrate with a solution in said solution holding member under such conditions that one of said members is sliding against the other, without stopping the sliding movement of one of said members, whereby the thickness of said epitaxial growth layer is controlled by the sliding speed of one of said members.

2. The method of claim 1, wherein said substrate is a semiconductor substrate and said epitaxial growth layer is a semiconductor crystalline layer.

3. The method of claim 2, wherein said substrate is an InP substrate and said epitaxial growth layer is an InGaAsP layer.

4. In a liquid phase epitaxial growth method using a substrate holding having a recess for receiving a semiconductor substrate on which epitaxial growth layers are formed, and a solution holder for holding a plurality of different kinds of solutions for us in epitaxial growth, the improvement comprising:

sliding a substrate holder against a solution holder at a predetermined constant speed in a first direction;

forming a first epitaxial growth layer having a thickness of less that 500Å on a substrate under such conditions that said substrate holder is sliding against said solution holder, without topping the sliding movement of said substrate holder, whereby the thickness of said first epitaxial growth layer is controlled by the sliding speed of said substrate holder;

forming a second epitaxial growth layer having a thickness of more than 500Å on said first epitaxial growth layer under such conditions that said slider stops its sliding movement, whereby the thickness of said second epitaxial growth layer is controlled by controlling the time at which said substrate holder is kept in a stopped condition under such conditions wherein said substrate contacts a second solution of said plurality of solutions; and repeating the steps of forming said first and second epitaxial growth layers by moving said slider in a second direction so that a third epitaxial growth layer of less that 500 Å thickness is formed on said second epitaxial growth layer and a fourth epitaxial growth layer of more than 500 Å thickness is formed on said third epitaxial growth layer.

5. The method of claim 4, wherein said substrate is a semiconductor substrate and said epitaxial growth layers are a semiconductor crystal.

6. The method of claim 5, wherein said substate an InP substrate and said epitaxial growth layers are InGaAsP layer.

7. The method of claim 4, wherein the pluralty of epitaxial growth layers formed are multi-quantum well epitaxial layers.

8. The method of claim 4, wherein the plurality of epitaxial growth layers formed are used for producing a semiconductor laser.

9. In a liquid phase epitaxial growth method using a substrate holder having a recess for receiving a semiconductor substrate on which epitaxial growth layers are formed, and a solution holder for holding plural kinds of solutions for use on epitaxial growth, the improvement comprising:

sliding a substrate holder against a solution holder at a predetermined constant speed in a first direction;

forming a first epitaxial growth layer having a thickness of less than 500 Å on a substrate under such conditions that said substrate holder is sliding against said solution holder, without stopping the sliding movement of said substrate holder, whereby the thickness of said first epitaxial growth layer is controlled by the sliding speed of said substrate holder;

forming a second epitaxial growth layer having a thickness of less than 500Å on said first epitaxial growth layer under such conditions that said substrate holder is sliding against said solution holder, without stopping the sliding movement of said substrate holder, whereby the thickness of said second epitaxial growth layer is controlled by the sliding speed of said substrate holder;

sliding said slider against said solution holder at a predetermined constant speed in a second direction opposite to said first direction; and repeating the steps of forming said second and first epitaxial growth layers in the sliding movement of said slider in said second direction.

10. The method of claim 9, wherein said substrate is a semiconductor substrate and said epitaxial growth layers are semiconductor crystalline layers.

11. The method of claim 10, wherein said substrate is an InP substrate and said epitaxial growth layers are InGaAsP layer.

12. The method of claim 9, wherein said plurality of epitaxial growth layers are multi-quantum well epitaxial layers.

13. The method of claim 9, wherein said plurality of epitaxial growth layers are used for producing a semiconductor laser.

14. In a semiconductor laser having multi-quantum well layers as an active region, said multi-quantum well layers are formed by a liquid phase epitaxial growth method using a substrate for holding a substrate on which an epitaxial growth layer is formed, and a solution which holds solution for use in epitaxial growth, the improvement comprising:

sliding one of said substrate holding member and solution holding member against the other thereof by a predetermined constant speed; and forming an epitaxial growth layer having thickness of less than 500 Å said substrate under the condition that one of said members is sliding against the other, without stopping the sliding movement of one of the members, whereby the thickness of said epitaxial growth layer is controlled by sliding speed of one of said members.

* * * * *